United States Patent
Uchida et al.

(10) Patent No.: US 7,216,545 B2
(45) Date of Patent: May 15, 2007

(54) ACID-RESISTANT PRESSURE SENSOR

(75) Inventors: Kouji Uchida, Kariya (JP); Norihiro Katayama, Obu (JP); Keiji Horiba, Nishikasugai-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/283,908

(22) Filed: Nov. 22, 2005

(65) Prior Publication Data

US 2006/0137458 A1  Jun. 29, 2006

(30) Foreign Application Priority Data

Dec. 24, 2004  (JP)  .............................. 2004-372941

(51) Int. Cl.
*G01L 9/00* (2006.01)
(52) U.S. Cl. .......................................... 73/705; 73/754
(58) Field of Classification Search ................ 73/754, 73/700, 706; 257/254
See application file for complete search history.

(56) References Cited

U.S. PATENT DOCUMENTS 6,260,417 B1 *  7/2001  Watanabe et al. ............. 73/754
6,512,255 B2    1/2003  Aoki et al.

FOREIGN PATENT DOCUMENTS

JP        2005326338 A  *  11/2005

* cited by examiner

*Primary Examiner*—Andre J. Allen
(74) *Attorney, Agent, or Firm*—Posz Law Group, PLC

(57) ABSTRACT

A pressure sensor includes a housing with which terminals are insert-molded, a sensing element mounted on the housing and electrically connected to the terminals, an electrically insulating protective member for covering the terminals and the sensing element. The protective member has a triple-layer structure. The first protective member for covering the terminals has high elasticity to prevent bubbles from being produced in the protective member. The second protective member for covering the sensing element has low elasticity to reduce stress applied to the sensing element. The third protective member having higher acid resistance covers the second protective member so that the sensor has high acid resistance without sacrificing the sensor characteristics.

5 Claims, 1 Drawing Sheet

ACID-RESISTANT PRESSURE SENSOR

CROSS REFERENCE TO RELATED APPLICATION

This application is based on and incorporates herein by reference Japanese Patent Application No. 2004-372941 filed on Dec. 24, 2004.

FIELD OF THE INVENTION

The present invention relates to an acid-resistant pressure sensor.

BACKGROUND OF THE INVENTION

A pressure sensor generally has a resin housing with which a conductive member as a terminal is insert-molded, and a sensing element mounted on the resin housing and electrically connected to the conductive member.

In the housing, the conductive member and the sensing element are covered with a protective member made of an electrical insulating material such as gel. For example, in a pressure sensor disclosed in U.S. Pat. No. 6,512,255 corresponding to JP-A 2001-304999, a protective member has a double-layer structure such that a second protective member is stacked on a first protective member. The first protective member made of fluorine-based rubber covers the conductive member and an electrical connection portion between the conductive member and a wiring connected to the sensing element. The second protective member made of fluorine-based gel covers the sensing element and a connection portion between the sensing element and the wiring connected to the conductive member. Generally, a bonding wire connects the conductive member and the sensing element. The first protective layer has a relatively high Young's modulus, i.e., high elasticity. The second protective member has a lower Young's modulus, i.e., lower elasticity than the first protective member.

It has been considered that the first protective member prevents air trapped between the conductive member and the housing from expanding and moving around in the protective member, because the first protective member having high elasticity covers the conductive member and the periphery thereof. Thus, reduction of insulating performance of the protective material may be prevented.

Further, the sensing element is covered with the second protective member having low elasticity so that pressure applied to the sensor is properly transmitted to the sensing element through the second protective member. Therefore, sensor characteristics of the sensor are adequately ensured.

Furthermore, the second protective member covers the connection portion between the sensing element and the bonding wire as a wiring, thereby preventing the bonding wire from being disconnected.

In the sensor described above, however, the second protective member made of fluorine-based gel is exposed at its top surface. Fluorine gel cannot tolerate under a high acid condition, PH of which is lower than 3, for example. Therefore, when the sensor is used in such a condition, the second protective member is corroded.

As a result of the corrosion, water may penetrate the second protective member so that elasticity of the second protective member may change. Accordingly, for example, variations may occur in pressure transmission to the sensing element through the second protective member, and the sensor characteristics may vary.

SUMMARY OF THE INVENTION

In view of the above-described problem, it is an object of the present invention to provide a pressure sensor having high acid resistance without sacrificing sensor characteristics.

A pressure sensor includes a housing with which a conductive member as a terminal is insert-molded, a sensing element mounted on the housing and electrically connected to the conductive member, a protective member having an electrical insulating property and covering the conductive member and the sensing element. The sensing element detects pressure and produces an electrical signal in accordance with the detected pressure. The protective member has a triple-layer structure such that a second protective member is stacked on a first protective member and a third protective layer covers the second protective layer.

The first protective member is made of fluorine-based rubber and covers the conductive member and an electrical connection portion between the conductive member and a wiring connected to the sensing element. The second protective member made of fluorine-based gel covers the sensing element and an electrical connection portion between the sensing element and the wiring connected to the conductive member. The third protective member made of a material having higher acid resistance than the fluorine-based gel covers the second protective member.

The third protective member having higher acid resistance than fluorine-based gel protects a top surface of the second protective member made of fluorine-based gel.

Further, the sensing element is covered with the second protective member having relative low elasticity so that pressure applied to the sensor is properly transmitted to the sensing element through the second protective member. Therefore, sensor characteristics are adequately ensured.

Thus, the sensor has high acid resistance without sacrificing the sensor characteristics.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
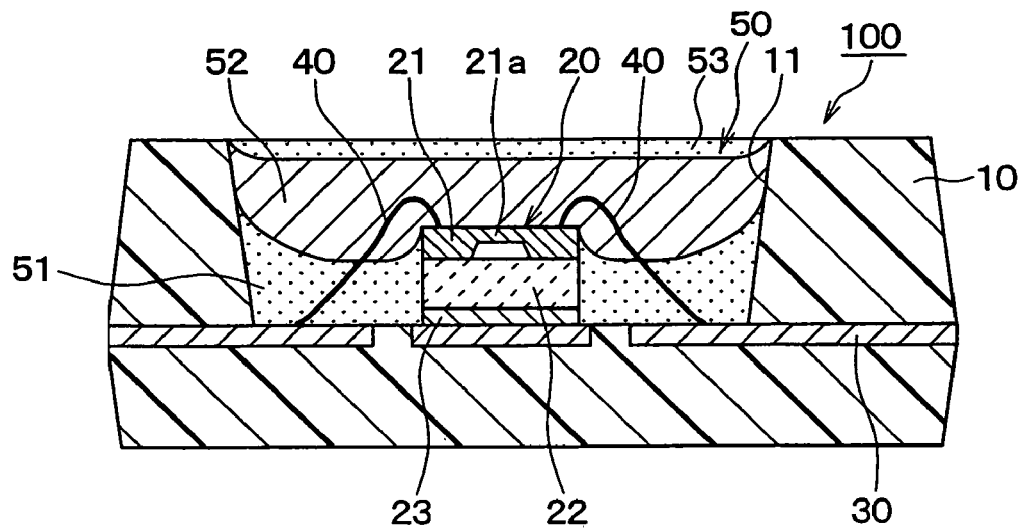
FIG. 1 is a schematic cross sectional view showing a pressure sensor according to an embodiment of the present invention.

Reference is made to FIG. 1, which shows a pressure sensor 100 according to an embodiment of the present invention. As an example, the pressure sensor 100 is a manifold pressure sensor, which is used under an environment of chemicals such as gasoline. The sensor 100 includes a housing 10, a sensing element 20, terminals 30, bonding wires 40, and a protective member 50.

The housing 10 is made of resin material such as polyphenylene sulfide (PPS), polybutylene terephthalate (PBT), or epoxy resin. The housing 10 has a hollow portion 11 on its top surface to accommodate the sensing element 20.

The terminals 30 as a conductive member are integrally formed with the housing 10 by an insert molding method and partly exposed from a bottom surface of the hollow portion 11. The terminals 30 are made of a conductive material such as copper.

The exposed portions of the terminals 30 are gold-plated to be functional as bonding pads. The terminal 30 has other exposed portions (not shown) than the bonding pad portions so as to connect the sensor to an external device.

The sensing element 20, which is mounted in the hollow portion 11 of the housing 10, includes a sensor chip 21 and a glass base 22 for holding the sensor chip 21. The sensor chip 21 is a semiconductor chip that detects pressure and produces an electrical signal in accordance with the detected pressure.

As an example, the sensor chip 21 detects pressure by using piezoresistance effect. The sensor chip 21 has a diaphragm 21a, which is deformed at the time of receiving the pressure on its surface, and a diffusion resistor (not shown).

The sensor chip 21 is die-bonded to the bottom surface of the hollow portion 11 through the glass base 22 by, for example, an adhesive member 23 such as a silicon rubber. The sensor chip 21 is electrically connected to the bonding pads of the terminals 30 through the bonding wires 40 made of gold, aluminum, or the like.

Thus, the sensing element 20 is mounted in the hollow portion 11 of the housing 10 and electrically connected to the terminals 30.

As shown in FIG. 1, the hollow portion 11 of the housing 10 is filled with the protective member 50 that has an electrical insulating property and covers the sensing element 20 and the terminals 30. The protective member 50 has a triple-layer structure such that a second protective member 52 is stacked on a first protective member 51 contacted with the bottom surface of the hollow portion 11 and a third protective member 53 is stacked on the second protective member 52.

The protective member 50 covers the sensing element 20, the terminals 30, the bonding wires 40, electrical connection portions where the bonding wires are connected to the sensor chip 21 and the terminals 30. Therefore, the sensing element 20, the terminals 30, the bonding wires 40, and the electrical connection portions are protected from chemical attack, electrical shorting, corrosion, and the like.

The first protective member 51 is disposed to cover the terminals 30, an interface between the housing 10 and the terminals 30, and the electrical connection portion where the terminals 30 are connected to one ends of the bonding wires 40. In this case, the bonding wires 40 are exposed at the other ends to be connected to the sensing element 20.

The second protective member 52 is disposed to cover a top surface of the first protective member 51, the sensing element 20, the electrical connection portion where the sensing element 20 is connected to the other ends of the bonding wires 40, and the bonding wires 40.

The first protective member 51 is made of fluorine-based rubber having high elasticity in order to prevent bubbles from being produced from an interface between the terminals 30 and the housing 10. The second protective member 52 is made of fluorine-based gel having low elasticity in order to reduce stress applied to the sensing element 20 and the bonding wires 40 to a minimum.

As an example, the first protective member 51 can be made of fluorine rubber or fluorosilicone rubber that has an electrical insulating property and a relatively high Young's modulus of 0.1 mega pascals (Mpa) or more. The second protective member 52 can be made of fluorine gel or fluorosilicone gel that has an electrical insulating property and a relatively low Young's modulus so as to have a 10 or more degrees of penetration under a ¼ cone falling test defined in Japanese Industrial Standards (JIS) K2220.

Further, in the sensor according to this embodiment, the third protective member 53 is disposed to cover the second protective member 52. The third protective member 53 is made of a material having higher acid resistance than the fluorine-based gel.

As an example, the third protective member 53 can be made of fluorine-based rubber, fluorine-based gel containing fluorine-based oil, or fluorine-based rubber containing fluorine-based oil, which have higher acid resistance than the fluorine-based gel.

Manufacturing process of the sensor 100 is described below.

A housing 10 with which the terminals 30 are insert-molded is prepared. The sensing element 20 is mounted on the housing 10 through the adhesive member 23. The sensor chip 21 is connected to the terminals 30 by the wire bonding method.

Then, the protective member 50 (i.e., the first to third protective members 51–53) is embedded in the hollow portion 11 of the housing 10 and is hardened by heat treatment. In this process, the first protective member 51, the second protective member 52, and the third protective member 53 sequentially are embedded in the hollow portion 11 and are independently or collectively hardened. Thus, the sensor 100 is manufactured.

The sensor 100 is installed in such a manner that the hollow portion 11 is coupled to an engine inlet duct for detecting manifold pressure with the sensing element 20. Here, the manifold pressure is negative pressure.

In the sensor 100, the third protective member 53 having higher acid resistance than fluorine-based gel protects the top surface of the second protective member 52 made of fluorine-based gel. Further, the sensing element 20 is covered with the second protective member 52 having relative low elasticity so that pressure applied to the sensor 100 is properly transmitted to the sensing element 20 through the second protective member 52. Therefore, sensor characteristics of the sensor 100 are adequately ensured.

Thus, the pressure sensor 100 has high acid resistance without sacrificing the sensor characteristics.

As described above, the first protective member 51 is made of fluorine-based rubber and the third protective member 53 is made of fluorine-based rubber or fluorine-based gel containing fluorine-based oil. Therefore, the first protective member 51 and the third protective member 53 can be made of the same material, i.e., fluorine-based rubber.

Figure 2:
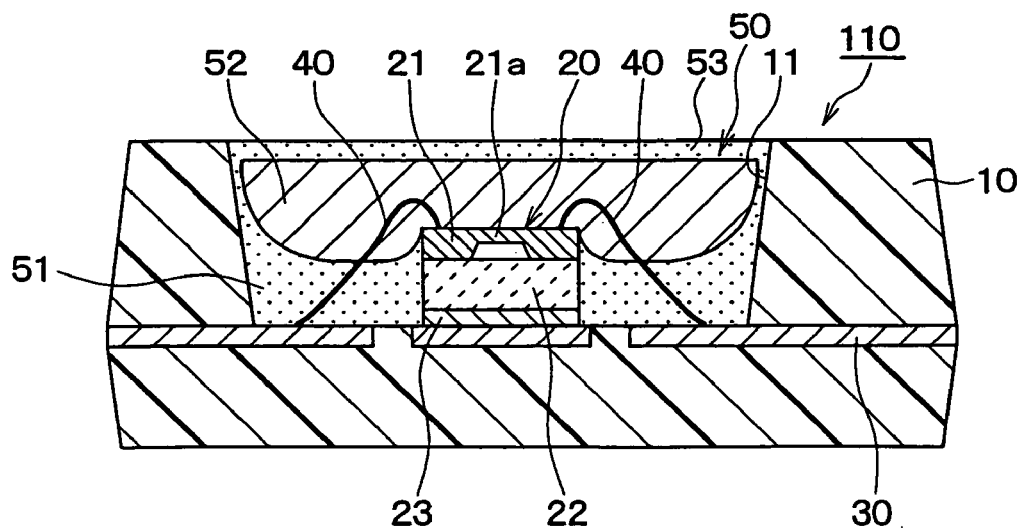
FIG. 2 is a schematic cross sectional view showing a modification of the pressure sensor shown in FIG. 1.

Reference is made to FIG. 2, which shows a pressure sensor 110 according to a modification of the sensor 100.

In the sensor 110, the first protective member 51 and the third protective member 53 of the protective member 50 are made of fluorine-based rubber. As shown in FIG. 2, the first protective member 51 and the third protective member 53 are formed as a single member that encloses the second protective member 52 made of fluorine-based gel.

Thus, the third protective member 53 having higher acid resistance than fluorine-based gel covers the second protective member 52 made of fluorine gel. Therefore, the pressure sensor 110 has the improved acid resistance without sacrificing the sensor characteristics.

The embodiment described above may be modified in various ways.

For example, a material for forming the housing 10 is not limited to resin, as long as the terminals 30 as a conductive member can be insert-molded with the housing 10.

The conductive member is not limited to the terminal 30, as long as the conductive member is arranged near the sensing element 20 and electrically connected to the sensing element 20.

The type of the sensing element 20 is not limited to a semiconductor diaphragm type using the piezoresistance effect, but may be other types such as an electrostatic capacitance type, or a piezoelectric element type.

The sensing element 20 and the terminals 30 may be connected through solder, conductive adhesive, or the like, instead of the bonding wires 40.

The present invention may be applied to various type sensors including the manifold pressure sensor.

Such changes and modifications are to be understood as being within the scope of the present invention as defined by the appended claims.

What is claimed is:

1. A pressure sensor comprising:
    a housing having a conductive member insert molded therewith;
    a sensing element disposed in the housing and electrically connected to the conductive member, the sensing element detecting a pressure and producing an electrical signal in accordance with the detected pressure; and
    a protective member which has an electrical insulating property and covers the conductive member and the sensing element, wherein
    the protective member includes a first protective member, a second protective member, and a third protective member,
    the first protective member is made of a fluorine-based rubber and covers the conductive member and a connection portion between the conductive member and the sensing element,
    the second protective member is made of a fluorine-based gel and disposed outside of the first protective member to cover the sensing element and the connection portion, and
    the third protective member is made of a material having a higher acid resistance than the fluorine-based gel and disposed outside of the second protective member to cover the second protective member.

2. The sensor according to claim 1, wherein
    the third protective member is made of fluorine-based rubber or fluorine-based gel containing fluorine-based oil.

3. The sensor according to claim 1, wherein
    the third protective member is made of fluorine-based rubber and integrated with the first protective member to provide a single-body protective member that encloses the second protective member.

4. A pressure sensor comprising:
    a housing having a conductive member disposed therein and a hollow portion;
    a sensing element disposed in a bottom surface of the hollow portion of the housing, the sensing element detecting a pressure and producing an electrical signal in accordance with the detected pressure;
    a wiring member for electrically connecting between the conductive member and the sensing element; and
    a protective member which has an electrical insulating property and covers the conductive member, the sensing element and the wiring member, wherein
    the conductive member includes a part exposed outside from the housing,
    the protective member includes a first protective member, a second protective member, and a third protective member,
    the first protective member is made of a fluorine-based rubber and disposed in the hollow portion to cover the conductive member,
    the second protective member is made of a fluorine-based gel and disposed on the first protective member to cover the sensing element, and
    the third protective member is made of a material having a higher acid resistance than the fluorine-based gel and disposed on the second protective member to cover the hollow portion of the housing.

5. The sensor according to claim 4, wherein
    the third protective member is made of fluorine-based rubber and integrated with the first protective member to provide a single-body protective member that encloses the second protective member.

* * * * *